United States Patent
Yamada

(10) Patent No.: US 7,019,274 B2
(45) Date of Patent: Mar. 28, 2006

(54) SOLID STATE IMAGE PICKUP DEVICE WITH WIDE DYNAMIC RANGE

(75) Inventor: Tetsuo Yamada, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 77 days.

(21) Appl. No.: 10/715,484

(22) Filed: Nov. 19, 2003

(65) Prior Publication Data

US 2004/0169125 A1 Sep. 2, 2004

(30) Foreign Application Priority Data

Dec. 9, 2002 (JP) .................. 2002-356813

(51) Int. Cl.
*H04N 5/335* (2006.01)
(52) U.S. Cl. .................. 250/208.1; 257/232
(58) Field of Classification Search ............ 250/208.1; 348/315, 275; 257/446–448
See application file for complete search history.

(56) References Cited

U.S. PATENT DOCUMENTS 6,831,692 B1 * 12/2004 Oda .................. 348/315

FOREIGN PATENT DOCUMENTS

| EP | 1 331 670 A2 | 7/2003 | |
|----|---|---|---|
| EP | 1 351 311 A2 | 10/2003 | |
| JP | 5-175471 | 7/1993 | |
| JP | 09-116815 | 5/1997 | |
| JP | 09-252107 | 9/1997 | |
| JP | 10-289052 | * 10/1998 | .................. 348/315 |

* cited by examiner

*Primary Examiner*—David Porta
*Assistant Examiner*—Tony Ko
(74) *Attorney, Agent, or Firm*—Arent Fox, PLLC

(57) ABSTRACT

A solid state image pickup device, having: a semiconductor substrate; a plurality of pixels formed on the semiconductor substrate, each pixel having a plurality of photoelectric conversion elements inclusive of a first photoelectric conversion element and a second photoelectric conversion element electrically separated; and a light shielding film formed over the semiconductor substrate, the light shielding film having an opening above each pixel, wherein the first and second photoelectric conversion elements have different saturated exposure amounts. A solid state image pickup device is provided which has a high sensitivity and a broad optical dynamic range.

25 Claims, 5 Drawing Sheets

TRANSFER DIRECTION    TRANSFER DIRECTION

SOLID STATE IMAGE PICKUP DEVICE WITH WIDE DYNAMIC RANGE

CROSS REFERENCE TO RELATED APPLICATION

This application is based on and claims priority of Japanese Patent Application No. 2002-356813 filed on Dec. 9, 2002, the entire contents of which are incorporated herein by reference.

BACKGROUND OF THE INVENTION

A) Field of the Invention

The present invention relates to a solid state image pickup device and its driving method, and more particularly to a solid state image pickup device having a broad optical dynamic range and its driving method.

B) Description of the Related Art

Solid state image pickup devices, typically CCD image sensors, have been developed heretofore by placing the most important issue on high integration and high sensitivity of a constituent element, pixel. A solid state image pickup device having one million pixels or more is not rare nowadays. High sensitivity also makes remarkable progress due to the development of various techniques. Application to digital cameras has achieved the performance of resolution and sensitivity superior to that of a conventional silver salt film.

However, as to the dynamic range (optical dynamic range) of exposure amount, a solid state image pickup device is far inferior to a conventional silver salt film. A narrow optical dynamic range causes various phenomena including so-called white blank areas: an area uniformly painted solid white in the details of a white wedding dress photographed with a camera flash and an area unnaturally painted solid white in the highlighted portions of the tip of a nose and cheeks; and an inability of rendering a background scene outside a window in a photographed indoor scene.

In a photodiode of a solid state image pickup device, electric charges are optically excited and accumulated in proportion to an exposure amount. There is a maximum value of charges capable of being accumulated in each photodiode. When the charge amount reaches the maximum value, no more charges will be accumulated. The characteristics of a photodiode show a linear region where the amount of charges is proportional to the exposure amount and a saturated region where the amount of charges will not increase more than the maximum value. The higher the sensitivity, the output voltage saturates at the lower exposure amount. In order to achieve a broad optical dynamic range, the lower the sensitivity, the better. However, as the sensitivity is lowered, it becomes difficult to photograph a relatively dark subject.

FIG. 5 is a graph showing the photoelectric conversion characteristics of a solid state image pickup device. The abscissa represents an exposure amount of incidence light on a solid state image pickup device (not on each photoelectric conversion element). The ordinate represents an output voltage generated by the solid state image pickup device in accordance with electric charges accumulated in photoelectric conversion elements. A saturated output voltage is a voltage at which the output voltage saturates even if the exposure amount is increased. At the saturated output voltage, the maximum amount of electric charges is accumulated in photoelectric conversion elements. A saturated exposure amount is an amount at the time when the output voltage takes the saturated output voltage.

Two sensitivity characteristics HS and LS are shown having the same saturated output voltage Vsat.

A curve LS represents a low sensitivity with a small increase in an output voltage relative to a unit exposure amount. An exposure amount reaching the saturated output voltage Vsat, i.e., a saturated exposure amount SEL, is large, resulting in a broad optical dynamic range DL.

A curve HS indicates a large increase in an output voltage (sensitivity) relative to a unit exposure amount, representing a high sensitivity. A saturated exposure amount SEH reaching the saturated output voltage Vsat is low, resulting in a narrow optical dynamic range DH. As seen from FIG. 5, a high sensitivity narrows the optical dynamic range.

FIG. 6 is a plan view illustrating an example of conventional techniques realizing a broad optical dynamic range. On a semiconductor chip, a plurality of photodiodes 51, 52 are disposed in a square or tetragonal matrix shape. Along each photodiode column, a vertical charge transfer device (VCCD) 55 is disposed. The photodiodes 51 and 52 have the same area and the same saturated output voltage. One end of each vertical charge transfer device 55 is coupled to a horizontal charge transfer device (HCDD) 56. An output of the horizontal charge transfer device 56 is supplied to an output circuit 57.

A light shielding film is formed above the photodiodes to define an opening for each photodiode. An opening 53 above the photodiode 51 in an odd row is broad, whereas an opening 54 above the photodiode 52 in an even row is narrow. An amount of light passing through the opening changes with the area of the opening. At the same exposure amount, the light amount received by the photodiode 52 having the narrow opening 54 is smaller than that received by the photodiode 51 having the broad opening 53.

The sensitivity of the photodiode 52 with the narrow opening 54 is therefore lower than that of the photodiode 51 with the broad opening 53. The photodiode 51 has the high sensitivity characteristics HS shown in FIG. 5 and the photodiode 52 has the low sensitivity characteristics LS shown in FIG. 5.

The sensitivity of the high sensitivity photodiode 51 is represented by R1 and that of the low sensitivity photodiode 52 is represented by R2. Since both the photodiodes have the same saturated output voltage, the saturated exposure amount of the low sensitivity photodiode 52 is R1/R2 times the saturated exposure amount of the high sensitivity photodiode.

Image signals are read to an external from the high sensitivity photodiode 51 and low sensitivity photodiode 52 and thereafter synthesized. An image of a small light amount dark area in a photographed scene can be generated mainly from a signal from the high sensitivity photodiode 51, whereas an image of a large light amount bright area in the photographed scene can be generated mainly from a signal from the low sensitivity photodiode 52. With this structure, an image pickup device can be obtained which has a high sensitivity and a broad optical dynamic range.

The structure shown in FIG. 6 forms one pixel by one high sensitivity photodiode 51 and one low sensitivity photodiode 52. Since one pixel is constituted of two photodiodes, the number of effective pixels is reduced to a half and the resolution is lowered to a half.

Another approach for obtaining a broad dynamic range is to photograph the same scene twice with the same photodiodes. High sensitivity photographing and low sensitivity photographing are performed during different signal accumulation time durations, a long exposure time and a short exposure time, respectively. Two images photographed during different time durations are synthesized so that a high sensitivity and broad optical dynamic range can be obtained similar to the structure shown in FIG. 6. Although this approach is effective for a standstill subject, a reproduced image of a moving subject is corrupted because two different photographing times are incorporated. These techniques described above are disclosed, for example, in Japanese Patent Laid-open Publications Nos. HEI-09-116815 and HEI-09-252107.

SUMMARY OF THE INVENTION

An object of this invention is to provide a solid state image pickup device having a high sensitivity and a broad optical dynamic range.

Another object of this invention is to provide a solid state image pickup device having a high resolution, a high sensitivity and a broad optical dynamic range.

Further object of this invention is to provide a novel driving method for such a solid state image pickup device mentioned above.

Still another object of this invention is to provide techniques of broadening an optical dynamic range by maintaining synchronicity without sacrificing a resolution.

According to one aspect of the present invention, there is provided a solid state image pickup device, comprising: a semiconductor substrate; a plurality of pixels formed on the semiconductor substrate, each pixel having a plurality of photoelectric conversion elements inclusive of a first photoelectric conversion element and a second photoelectric conversion element electrically separated; and a light shielding film formed over the semiconductor substrate, the light shielding film having an opening above each pixel, wherein at least the first photoelectric conversion element and the second photoelectric conversion element have different saturated exposure amounts.

According to another aspect of the present invention, there is provided a driving method for a solid state image pickup device, comprising: a semiconductor substrate; a plurality of pixels formed on the semiconductor substrate, each pixel having a plurality of photoelectric conversion elements inclusive of a first photoelectric conversion element and a second photoelectric conversion element electrically separated; and a light shielding film formed over the semiconductor substrate, the light shielding film having an opening above each pixel, wherein the first photoelectric conversion element and the second photoelectric conversion element have different saturated exposure amounts, the driving method comprising the steps of: reading a first signal charge from the first photoelectric conversion element during a first signal read period; and reading a second signal charge from the second photoelectric conversion element during a second signal read period following the first signal read period.

According to another aspect of the present invention, there is provided a driving method for a solid state image pickup device, comprising: a semiconductor substrate; a plurality of pixels formed on the semiconductor substrate, each pixel having a plurality of photoelectric conversion elements inclusive of a first photoelectric conversion element and a second photoelectric conversion element electrically separated; and a light shielding film formed over the semiconductor substrate, the light shielding film having an opening above each pixel, wherein at least the first photoelectric conversion element and the second photoelectric conversion element have different saturated exposure amounts, the driving method comprising the steps of: reading first and second signal charges from the first and second photoelectric conversion elements; and synthesizing the first and second signal charges in signal reading means.

As above, the optical dynamic range of a solid state image pickup device can be broadened. A solid state image pickup device can be provided which has a high sensitivity and a broad optical dynamic range.

It is also possible to maintain synchronicity without sacrificing a resolution.

DESCRIPTION OF THE PREFERRED EMBODIMENTS

Embodiments of the invention will be described with reference to the accompanying drawings.

Figure 1A:
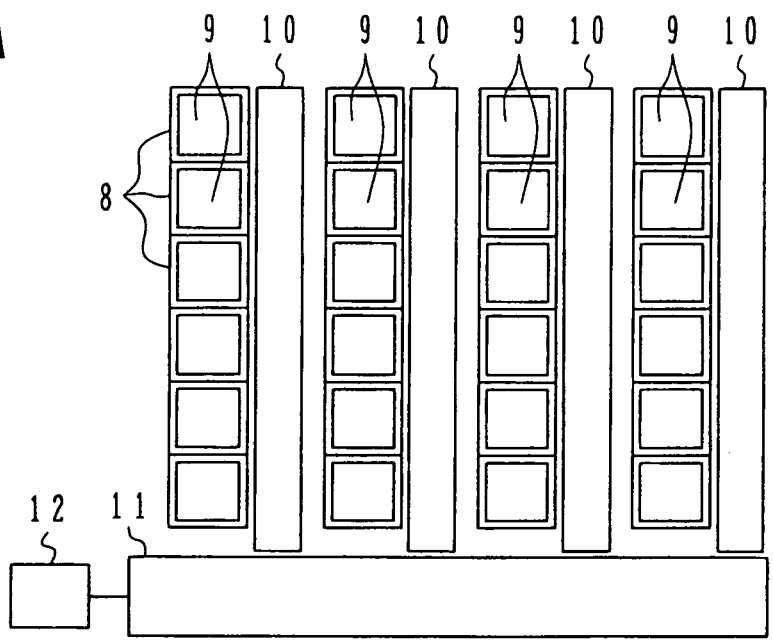
FIGS. 1A to 1C are plan views and a cross sectional view of a solid state image pickup device according to the first embodiment of the invention.
Figure 1B:
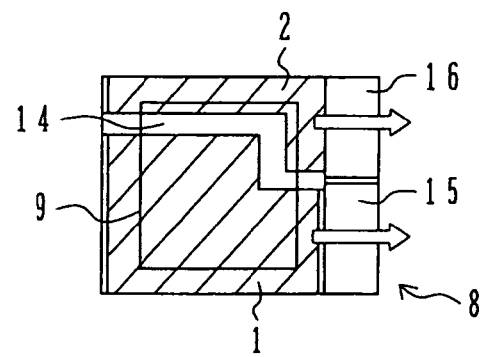
Figure 1C:
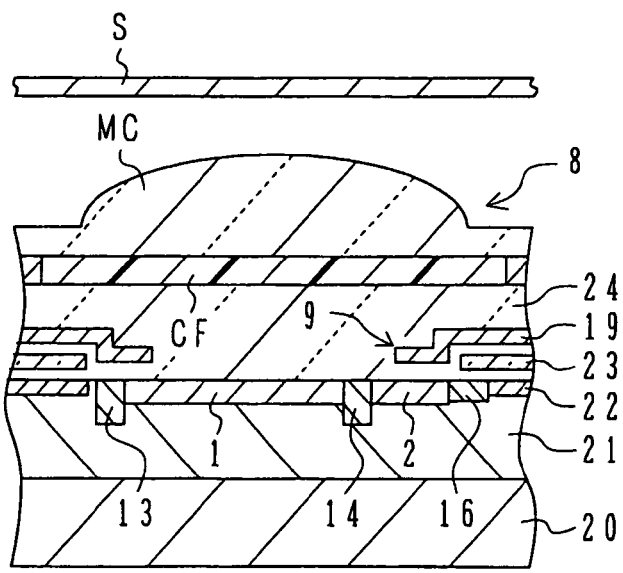

FIGS. 1A, 1B and 1C are plan views and a cross sectional view of a solid state image pickup device according to the first embodiment of the invention. FIG. 1A is a schematic plan view of the solid state image pickup device having a plurality of pixels, FIG. 1B is an enlarged view of a photodiode area of one pixel, and FIG. 1C is a cross sectional view of one pixel.

As shown in FIG. 1A, a plurality of pixels 8 are disposed on a silicon substrate in a square or tetragonal matrix configuration, and a light shielding film formed above the silicon substrate defines an opening 9 for each pixel. A vertical charge transfer device (VCCD) 10 as a charge read means is disposed along each pixel column on its right side to transfer electric charges read from pixels 8 in a vertical direction. One horizontal charge transfer device (HCCD) 11 is disposed coupling output terminals of a plurality of VCCDs. The horizontal charge transfer device (HCCD) 11 receives signal charges of one row from VCCDs and transfer them at high speed to an output circuit 12.

As shown in FIG. 1B, each pixel 8 includes photoelectric conversion elements, a main photodiode 1 and a subsidiary photodiode 2 separated by an insolation region 14. In order to make easy to understand this structure, regions of the photodiodes are shown hatched. The main photodiode 1 and subsidiary photodiode 2 are provided with transfer regions 15 and 16, respectively, on the right side thereof. The main photodiode 1 and subsidiary photodiode 2 have generally the same vertical height in the areas in contact with the transfer regions 15 and 16, and face transfer stages of VCCD 10 via the transfer regions 15 and 16. Electric charges accumulated in the main photodiode 1 and subsidiary photodiode 2 are respectively read to VCCD 10 via the transfer regions 15 and 16 as indicated by arrows.

In areas remote from the transfer regions 15 and 16, the vertical height of the main photodiode 1 is increased whereas the vertical height of the subsidiary photodiode 2 is decreased correspondingly. Therefore, the area of the main photodiode 1 is broad and that of the subsidiary photodiode 2 is narrow. The saturated output voltage differs in accordance with the photodiode area. A relatively high saturated output voltage of the main photodiode is represented by Vsat1 and a relatively low saturated output voltage of the subsidiary photodiode is represented by Vsat2.

The opening 9 of the light shielding film is provided above each pixel and exposes partial areas of the main photodiode 1 and subsidiary photodiode 2. Although most of the area of the main photodiode 1 are exposed in the opening 9, only a limited area of the subsidiary photodiode 2 is exposed in the opening 9. At least half of the area of the subsidiary photodiode 2 is covered with the light shielding film. Depending upon a difference between ratios (opening or aperture ratios) of the exposed area in the opening to the photodiode area, the main photodiode 1 has a high sensitivity R1 and the subsidiary photodiode 2 has a low sensitivity R2 (R1>R2).

The saturated exposure amount SE is in inverse proportion to the sensitivity R and in proportion to a saturated output voltage Vsat corresponding to the maximum accumulated charge amount. This relation is simply expressed by SE=Vsat/R by omitting coefficients. The saturated exposure amount SE1 of the main photodiode 1 is SE1=Vsat1/R1 and the saturated exposure amount SE2 of the subsidiary photodiode 2 is SE2=Vsat2/R2.

FIG. 1C shows the cross sectional structure of one pixel. An n-type silicon substrate 20 has a p-type layer 21 formed in a surface portion of the substrate. On the surface of the p-type layer 21, n-type regions are disposed to form the main photodiode 1 and subsidiary photodiode 2. Between these photodiodes, a p-type isolation region 14 is formed. On the right side of the subsidiary photodiode 2, an n-type channel region 22 of VCCD is formed with the transfer region 16 being interposed therebetween. On the left side of the main photodiode 1, a p-type isolation region 13 is formed between the adjacent column VCCD and photodiode.

Above the channel region 22 of VCCD and the transfer region 16, a transfer electrode 23 is formed both for the control of transferring charges read from the photodiode and for the transfer of charges in VCCD. The transfer electrode can be made of known two-layer polysilicon electrodes or it may also be made of single-layer, or three-layer polysilicon electrodes. A light shielding film 19 of W or the like is formed covering VCCD 10 and HCCD 11 and has openings 9 formed therethrough.

An insulating layer 24 having a flat surface is formed covering the light shielding film 19, and color filters CF are disposed on the insulating layer 24. A micro lens MC is formed on the color filter CF. One color filter CF and one micro lens MC are provided in correspondence with each opening. A mechanical shutter S is provided above the solid state image pickup device. Not all constituent elements are necessary. The color filter is not required for a monochrome solid state image pickup device. The mechanical shutter may be omitted by using only an electronic shutter. The micro lenses may be omitted depending upon application fields.

The structure shown in FIGS. 1A, 1B and 1C is similar to that of a known square layout CCD solid state image pickup device, excepting that one pixel has two photodiodes separated by the isolation region 14 and that VCCD can read electric charges from the two photodiodes. From the other viewpoint, this structure is equivalent to the structure that each photodiode of a known CCD solid state image pickup device is divided into a plurality of photodiodes and VCCD is disposed so as to deal with the divided photodiodes.

Consider now a photodiode having the main photodiode 1 and subsidiary photodiode 2 formed integrally. Namely, this photodiode is equivalent to a conventional non-divided photodiode having the structure that the isolation region 14 is removed and the main photodiode 1 and subsidiary photodiode 2 are made integral and continuous. A sensitivity of this non-divided photodiode is represented by R0, a saturated output voltage thereof is represented by Vsat0, and a saturated exposure amount thereof is represented by SE0.

Since the sensitivity corresponds to an amount of electric charges generated in proportion to an exposure amount, the following equation is established:

$$R0 = R1 + R2 \qquad (1)$$

Since the saturated output voltage is proportional to the maximum accumulated charge amount, the following equation is satisfied:

$$Vsat0 = Vsat1 + Vsat2 \qquad (2)$$

The saturated exposure amount is therefore given by:

$$SE0 = Vsat0/R0 = (Vsat1 + Vsat2)/(R1 + R2) \qquad (3)$$

By substituting Vsat1/Vsat2=x and R1/R2=y, then $$Vsat1 + Vsat2 = (x+1)Vsat2,$$

$$R1 + R2 = (y+1)R2$$

The saturated exposure amount of a non-divided photodiode is therefore given by:

$$SE0 = (x+1)Vsat2/(y+1)R2 = SE2 \cdot (x+1)/(y+1) \qquad (4)$$

Rewriting the equation (4) results in:

$$SE2/SE0 = (y+1)/(x+1) \qquad (5)$$

If the value of the equation (5) is made larger than "1", the optical dynamic range can be broadened. It can be seen from the equation (5) that the larger the value of y is and/or the smaller the value of x is, the saturated exposure amount SE2 of a subsidiary photodiode of a division type photodiode can be made more larger than the saturated exposure amount SE0 of a non-divided photodiode. By dividing the photodiode and increasing the saturated exposure amount of the subsidiary photodiode, the optical dynamic range can be broadened greatly.

In this state, since the sensitivity of the main photodiode can be made high, an image signal can be obtained at a high sensitivity and in a broad optical dynamic range by synthesizing image signals read from the main and subsidiary photodiodes. Assuming that y=15 and x=3, SE2/SE0=16/4=4. The optical dynamic range can be broadened four times that of a non-divided photodiode.

The smaller the value x is, the optical dynamic range can be made broader. However, the value x corresponds to the ratio of a main photodiode area to an associated subsidiary photodiode area. To make the value x small means to increase the ratio of the auxiliary photodiode area. In order not to degrade the characteristics of the main photodiode, it is preferable to suppress a decrease in the main photodiode area without making the area of the subsidiary photodiode too broad.

The value y corresponds to a sensitivity ratio and can be adjusted by the area of the photodiode exposed in the opening. The value y can be made large by broadening the area of the main photodiode exposed in the opening and narrowing the area of the subsidiary photodiode exposed in the opening.

The optical dynamic range can be broadened theoretically infinitely. According to the knowings of the present inventor, the adequate range of broadening the optical dynamic range is twice to ten times, in which range the broadening effects are explicit and the image quality is not unnatural. Three times to six times are particularly efficient as the broadening ratio.

In an actual operation, first, the first transfer region 15 is controlled to read signal charges from the main photodiode 1 and output them to an external. Thereafter, the second transfer region 16 is controlled to read signal charges from the subsidiary photodiode 2. Thereafter, both the image signals are synthesized in the external.

An image signal can be generated from the signal charges mainly from the high sensitivity main photodiode until the main photodiode saturates. Since a signal corresponding to an exposure amount can be obtained until the subsidiary photodiode saturates even if the main photodiode saturates, an image signal can be generated in a broad optical dynamic range by synthesizing the image signals obtained from signal charges.

Figure 2:
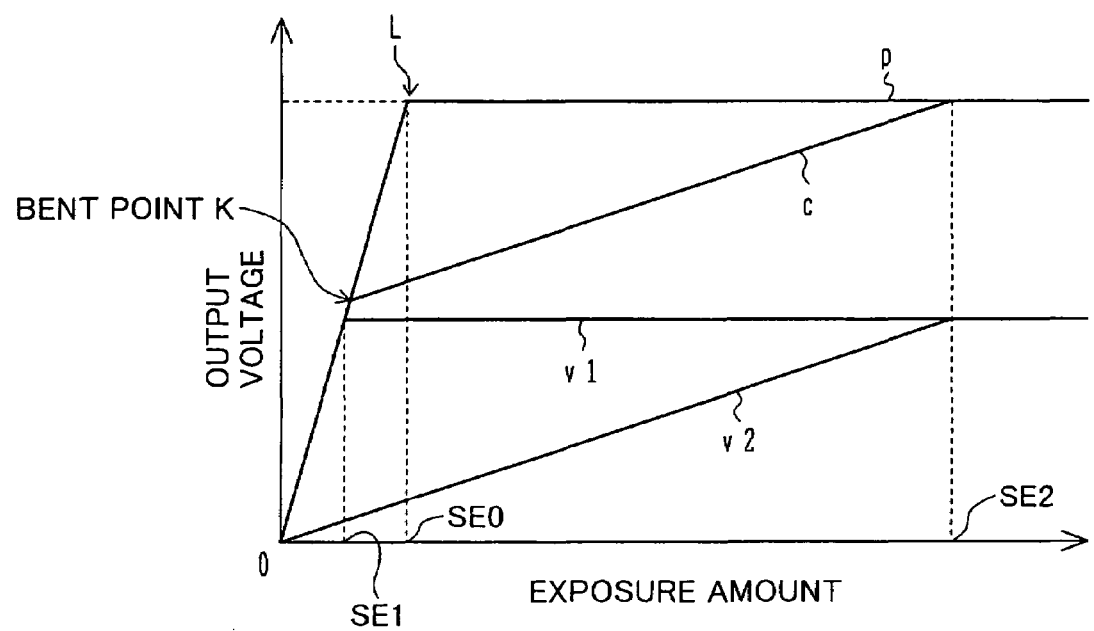
FIG. 2 is a graph explaining broadening an optical dynamic range according to the embodiment.

FIG. 2 is a graph explaining the principle of broadening an optical dynamic range. The abscissa represents an exposure amount and the ordinate represents an output voltage. For the purposes of simplicity, it is assumed that the main and subsidiary photodiodes have the same saturated output voltage (x=1) and the sensitivity ratio y is 10.

A curve v1 indicates the characteristics of the main photodiode, and a curve v2 indicates the characteristics of the subsidiary photodiode. Since the main photodiode has a high sensitivity, it reaches the main saturated exposure amount at a low exposure amount SE1. Since the subsidiary photodiode has a low sensitivity, it reaches the subsidiary saturated exposure amount at a high exposure amount SE2. The synthesized characteristics of both the characteristics are indicated by a curve c. The high sensitivity characteristics in the rising part change to the low sensitivity characteristics at a bent point K. An image signal corresponding to the exposure amount can be obtained until the exposure amount reaches the saturated exposure amount of the subsidiary photodiode.

A curve p indicates the characteristics of a non-division type photodiode given for the comparison purposes. The whole incidence light amount to the photodiode is the same as that of the division type photodiode. Although the characteristics in the rising part are the same as the synthesized characteristics c, the characteristics of the non-division type photodiode have no bent point. The exposure amount reaches the saturated exposure amount at an exposure amount SE0 (saturation point L) far lower than that of the curve c, and thereafter a constant output voltage is generated irrespective of an increase in the exposure amount. Although the range of the high sensitivity exposure amount is broader than the curve c, the optical dynamic range is narrow. In other words, according to the embodiment, the optical response characteristics are provided with the bent point K and the optical dynamic range can be broadened by dividing the photodiode and lowering the sensitivity of the subsidiary photodiode in the manner described in this embodiment.

Assuming that the characteristics of all main photodiodes are the same, signal charges from the main and subsidiary photodiodes may be added together in VCCD. In this case, a synthesized signal can be supplied directly from VCCD so that signal processing can be simplified.

It is inevitable under the present technical level that the characteristics of main photodiodes have some variation. When a signal from the subsidiary photodiode is added to the saturated voltage output of the main photodiode, variation in signals from main photodiodes will have amplified effect since the slope of the main photodiode in FIG. 2 is much steeper than the slope of the subsidiary photodiode. The saturated output voltages of main photodiodes can be made uniform by cutting the signal charges read from the main photodiodes at a certain constant level. By synthesizing image signals thereafter, variation in the characteristics of main photodiodes can be suppressed from adversely affecting the final image signal.

Figure 3A:
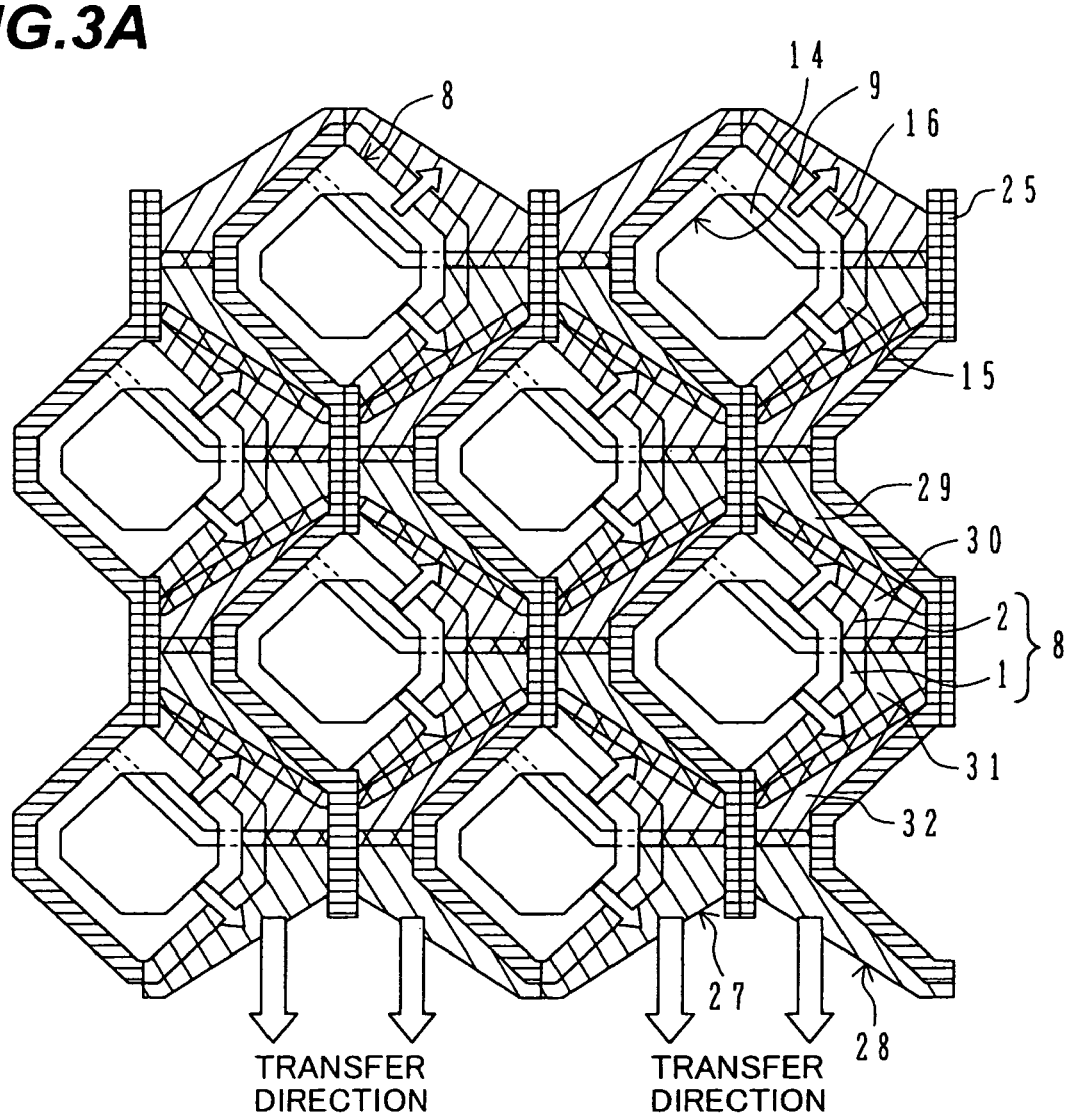
FIGS. 3A and 3B are plan views of a solid state image pickup device according to the second embodiment of the invention.
Figure 3B:
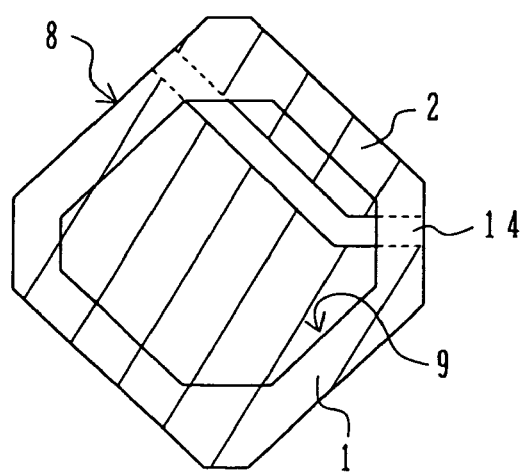

FIGS. 3A and 3B are plan views showing the structure of a solid state image pickup device according to the second embodiment of the invention. FIG. 3B shows the structure of one pixel photodiode. The photodiode region is shown hatched.

Referring to FIG. 3A, pixels 8 are disposed in a so-called pixel shift layout or honeycomb layout. Namely, pixels in each odd row and pixels in each even row are disposed shifted by a half pitch in the horizontal direction, and pixels in each odd column and pixels in each even column are disposed shifted by a half pitch in the vertical direction.

Each pixel 8 has basically a rhomboid or diamomd shape whose apex areas are truncated (i.e., strictly saying, has an octagon shape). By adopting rhomboidal pixels in the honeycomb layout, the wasteful area can be reduced and the width of a VCCD transfer path can be broadened.

As shown in FIG. 3B, each pixel 8 has a main photodiode 1 and a subsidiary photodiode 2 electrically separated by an isolation region 14. A light shielding film disposed above the pixels has openings 9 to partially expose the main photodiodes 1 and subsidiary photodiodes 2. The main photodiode 1 is disposed approximately along three sides of the rhomboidal area of the pixel, and the subsidiary photodiode 2 is disposed along the remaining side. Similar to the first embodiment, the area of the main photodiode exposed in the opening is broad, providing a large opening or aperture ratio, whereas the area of the subsidiary photodiode is narrow providing a small opening ratio.

As shown in FIG. 3A, VCCDs 27 and 28 extend along the pixels in columns and in the vertical direction in a zigzag way, and face the main photodiodes 1 and subsidiary photodiodes 2 via transfer regions 15 and 16. Four transfer electrodes 29, 30, 31 and 32 per one pixel are disposed over VCCDs 27 and 28. VCCDs 27 and 28 are bilateral symmetrical and every second VCCDs have the same shape.

The transfer electrodes 29 to 32 can be made of silicon electrodes of a two-layer polysilicon structure. The edge of the transfer electrode is not perpendicular to the extension direction of VCCD, but is disposed obliquely. The cross sectional area of the transfer electrode through which charges are transferred from one transfer stage to another can therefore be broadened and the transfer efficiency can be improved. Narrow channel effects are generated by a change in the width of a transfer electrode so that electric charges can be transferred also by drift. Therefore, although VCCD extends in a zigzag way, the charge transfer efficiency is high. The transfer electrode has hardly the portion functioning as simple wiring so that the area use efficiency is high.

By applying transfer control signals to the transfer electrodes, signal charges accumulated in the main photodiode 1 and subsidiary photodiode 2 of each pixel can be read separately to VCCDs 27 and 28 via the transfer regions 15 and 16 in the direction indicated by arrows. Read charges are transferred downward in each VCCD as indicated by an arrow.

Similar to the first embodiment, a high sensitivity and a broad optical dynamic range can be obtained by dividing each pixel into the main photodiode and subsidiary photodiode without sacrificing a resolution.

The length along which each pixel and VCCD face each other is long, and each one transfer electrode is disposed facing each of the main photodiode 1 and subsidiary photodiode 2. It is easy to independently and smoothly read charges from the main photodiode 1 and subsidiary photodiode 2 to VCCD. An isolation region 25 is disposed at the right of each VCCD to electrically separate adjacent columns.

Four transfer electrodes per one pixel are disposed over VCCD. It is therefore possible to read signal charges of all main photodiodes to VCCD at the same time, and transfer all signal charges by known four-phase driving at the same time to read them to an external. Similarly, it is possible to read signal charges of all subsidiary photodiodes to VCCD at the same time, and transfer all signal charges at the same time to read them to the external. It is preferable to shield light from the image pickup area by a mechanical shutter or the like after a predetermined image pickup time and thereafter perform a sequence of transfer operations.

In the first and second embodiments, the area of the subsidiary photodiode is set smaller than that of the main photodiode. If the characteristics in the high exposure amount ranges are significant, the area of the subsidiary photodiode may be made broad.

Figure 4A:
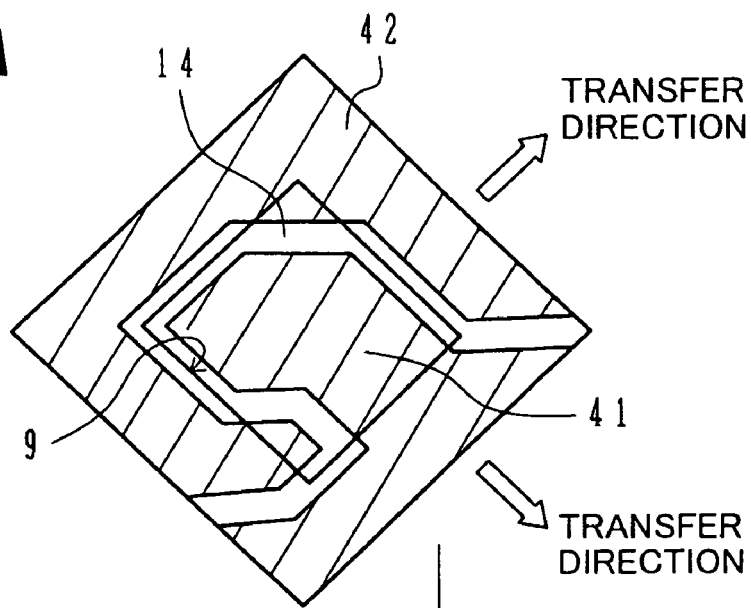
FIGS. 4A to 4C are plan views showing modifications of the pixel structure.

FIG. 4A shows a modification of the pixel structure. This structure is suitable for use with a CCD solid state image pickup device having a honeycomb layout of the second embodiment. A first photodiode 41 and a second photodiode 42 are electrically separated by an isolation region 14. The first photodiode 41 and second photodiode 42 are partially exposed in an opening 9 of a light shielding film.

Most of the opening 9 are occupied by the first photodiode 41 so that its sensitivity is high. Only a small area of the opening 9 is occupied by the second photodiode 42 so that its sensitivity is low. The second photodiode 42 occupies a broad area under the light shielding film. The area of the second photodiode 42 is equal to or broader than the area of the first photodiode 41. The second photodiode 42 generates therefore a high saturated output voltage. The value y in the equation (5) can be made large and the value x can be made small so that the optical dynamic range can be broadened easily.

Since the exposed areas of the second photodiode 42 are disposed in the two corner areas of the rhomboidal opening along a diagonal line, a change in the incidence light amount to be caused by inclination of the incidence light can be suppressed. Since light crawls under the light shielding film, the layout of the second photodiode along three sides of the rhomboid can further suppress a change in the incidence light amount to be caused by inclination of the incidence light. The structure shown in FIG. 4A provides the effects of reducing the sensitivity change as much as possible, which change is to be caused by inclined incidence light.

Figure 4B:
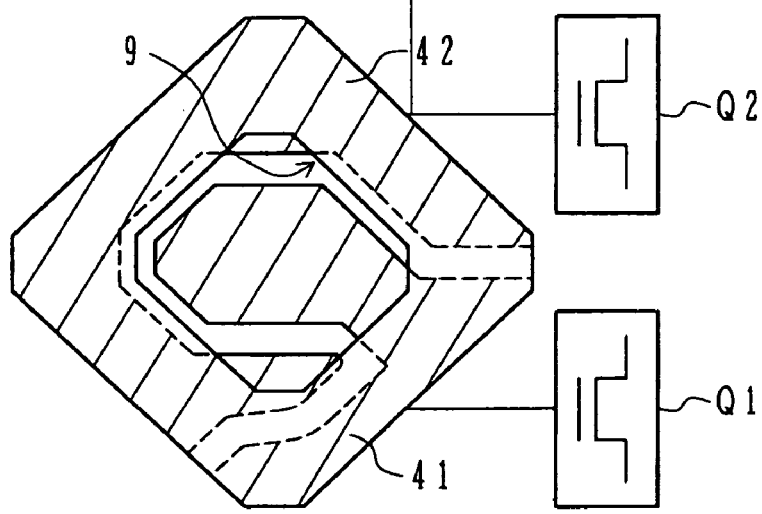

FIG. 4B shows another modification. Similar to the pixel shown in FIG. 4A, a first photodiode 41 and a second photodiode 42 are electrically separated by an isolation region 14. Although the second photodiode 42 has a narrow area in the opening and a low sensitivity, its saturated output voltage is set high because the area disposed under the light shielding film is broad. The shapes of the pixel and opening are a rhomboid shape whose apex areas are truncated. The first and second photodiodes 41 and 42 are connected to MOS transistor circuits Q1 and Q2 which read signal charges.

Figure 4C:
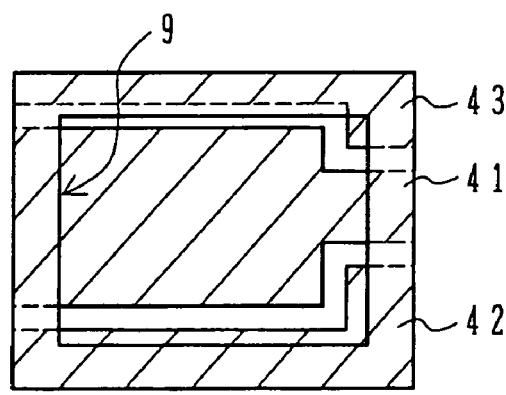
Figure 5:
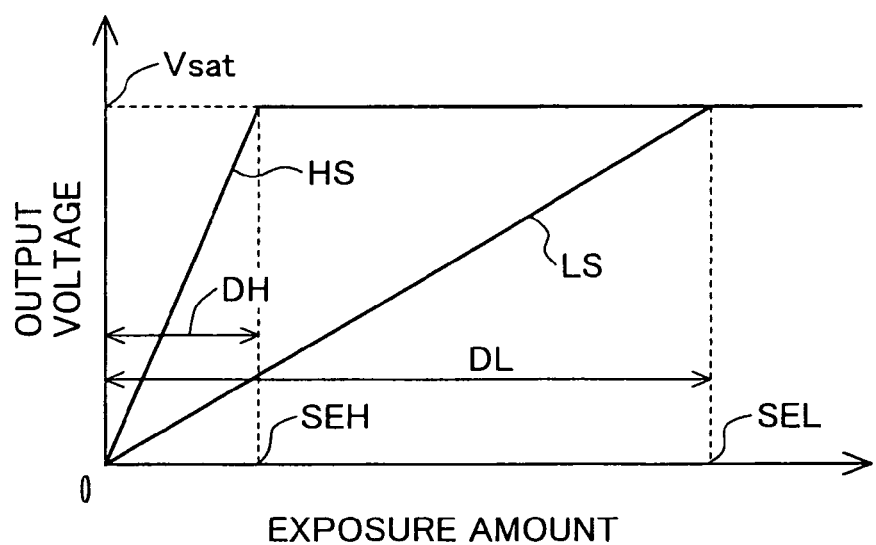
FIG. 5 is a graph showing the characteristics of a solid state image pickup device according to prior art.
Figure 6:
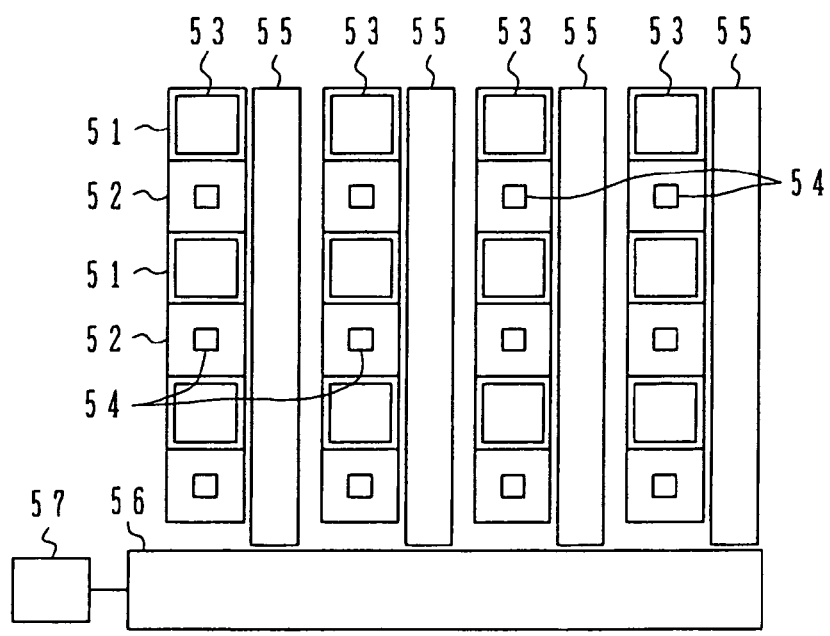
FIG. 6 is a plan view of a solid state image pickup device with a broadened optical dynamic range according to prior art.

FIG. 4C shows the structure that one pixel is divided into three photodiodes 41, 42 and 43. A broad area of a first photodiode 41 is exposed in an opening 9, a narrow area of a second photodiode 42 is exposed in the opening, and a very narrow area of a third photodiode 43 is exposed in the opening. Although the first photodiode 41 has a high sensitivity, its optical dynamic range is narrowest. The second photodiode 42 has an intermediate sensitivity and an intermediate optical dynamic range. The third photodiode 43 has the lowest sensitivity and the broadest optical dynamic range.

As described so far, the photosensitive region of each pixel is divided so that the optical dynamic range can be broadened. Since one pixel is divided, a sampling image having the spatially same phase can be distributed to and made incident upon the main and subsidiary photodiodes. The image obtained from the main photodiode and the unsaturated image obtained from the subsidiary photodiode can be made the same excepting a difference of signal charge amounts.

The present invention has been described in connection with the preferred embodiments. The invention is not limited only to the above embodiments. For example, a monochrome solid state image pickup device may be manufactured by omitting color filters. A three-plate type color image pickup device may be used. Also in these cases, the effect of broadening an optical dynamic range can be obtained. The number of divisions of a photodiode of each pixel can be changed as desired. It will be apparent to those skilled in the art that other various modifications, improvements, combinations, and the like can be made.

I claim:

1. A solid state image pickup device, comprising:
   a semiconductor substrate;
   a plurality of pixels formed on said semiconductor substrate, each pixel including a first photoelectric conversion element and a second photoelectric conversion element electrically separated; and
   a light shielding film formed over said semiconductor substrate, said light shielding film having only one opening above each pixel,
   wherein at least said first photoelectric conversion element and said second photoelectric conversion element have different saturated exposure amounts.

2. The solid state image pickup device according to claim 1, wherein assuming that a sensitivity of said first photoelectric conversion element is R1, the sensitivity being an amount of signal charges in response to an exposure amount, a saturated output voltage at a maximum accumulated charge amount is Vsat1, a sensitivity of said second photoelectric conversion element is R2, and a saturated output voltage of said second photoelectric conversion element is Vsat2, and Vsat1/Vsat2=x and R1/R2=y, a ratio (y+1)/(x+1) is larger than 1.

3. The solid state image pickup device according to claim 2, wherein (y+1)/(x+1) is in a range from 2 to 10.

4. The solid state image pickup device according to claim 1, wherein at least a half of a plan area of said second photoelectric conversion is covered with said light shielding film.

5. The solid state image pickup device according to claim 1, further comprising color filters formed above said semiconductor substrate, each of the color filters covering an upper area of said opening of one pixel.

6. The solid state image pickup device according to claim 1, further comprising micro lenses formed above said semiconductor substrate, each of the micro lenses covering an upper area of said opening of one pixel.

7. The solid state image pickup device according to claim 1, further comprising:
a charge reading device disposed near at each pixel;
a first transfer control electrode for transferring electric charges accumulated in said first photoelectric conversion element to said charge reading device; and
a second transfer control electrode electrically separated from said first transfer control electrode, for transferring electric charges accumulated in said second photoelectric conversion element to said charge reading device.

8. The solid state image pickup device according to claim 7, wherein a combined shape of said first photoelectric conversion element and said second photoelectric conversion element is a rhomboid shape or a truncated rhomboid shape, said first transfer control electrode is disposed along one side of the rhomboid shape, and said second transfer control electrode is disposed along another side of the rhomboid shape.

9. The solid state image pickup device according to claim 8, wherein said first photoelectric conversion element is disposed in a central area of the pixel and along one side of the rhomboid, and said second photoelectric conversion element is disposed at least along another side.

10. The solid state image pickup device according to claim 1, wherein said plurality of pixels are disposed two-dimensionally in horizontal and vertical directions, and horizontal positions of pixels disposed along adjacent horizontal lines are shifted.

11. A driving method for a solid state image pickup device, comprising:
a semiconductor substrate;
a plurality of pixels formed on said semiconductor substrate, each pixel including a first photoelectric conversion element and a second photoelectric conversion element electrically separated; and
a light shielding film formed over said semiconductor substrate, said light shielding film having only one opening above each pixel, wherein at least said first photoelectric conversion element and said second photoelectric conversion element have different saturated exposure amounts, the driving method comprising the steps of:
reading a first signal charge from said first photoelectric conversion element during a first signal read period; and
reading a second signal charge from said second photoelectric conversion element during a second signal read period following the first signal read period.

12. The driving method for a solid state image pickup device according to claim 11, wherein said plurality of pixels are put in a light shielding state when said first signal read period starts.

13. The driving method for a solid state image pickup device according to claim 11, further comprising the step of synthesizing an image signal from a first image signal generated from said first signal charge and a second image signal generated from said second signal charge.

14. The driving method for a solid state image pickup device according to claim 11, wherein when said first and second image signals are synthesized, component of an image signal with a relatively small saturated exposure amount above a predetermined level is cut off to make a maximum output uniform.

15. A driving method for a solid state image pickup device, comprising:
a semiconductor substrate;
a plurality of pixels formed on said semiconductor substrate, each pixel including a first photoelectric element and a second photoelectric conversion element electrically separated; and
a light shielding film formed over said semiconductor substrate, said light shielding film having only one opening above each pixel, wherein at least said first photoelectric conversion element and said second photoelectric conversion element have different saturated exposure amounts, the driving method comprising the steps of:
reading first and second signal charges from said first and second photoelectric conversion elements; and
synthesizing said first and second signal charges in signal reading device.

16. The solid state image pickup device according to claim 1, wherein said opening above each pixel in said light shielding film exposes at least a portion of said first photoelectric conversion element and a portion of said second photoelectric conversion element.

17. The driving method for a solid state image pickup device according to claim 11, wherein said opening above each pixel in said light shielding film exposes at least a portion of said first photoelectric conversion element and a portion of said second photoelectric conversion element.

18. The driving method for a solid state image pickup device according to claim 15, wherein said opening above each pixel in said light shielding film exposes at least a portion of said first photoelectric conversion element and a portion of said second photoelectric conversion element.

19. The solid state image pickup device according to claim 16, wherein for a sensitivity of said first photoelectric conversion element of R1, the sensitivity being an amount of signal charges in response to an exposure amount, a saturated output voltage at a maximum accumulated charge amount is Vsat1, a sensitivity of said second photoelectric conversion element is R2, and a saturated output voltage of said second photoelectric conversion element is Vsat2, and Vsat1/Vsat2=x and R1/R2=y, a ratio $(y+1)/(x+1)$ is larger than 1.

20. The solid state image pickup device according to claim 17, wherein for a sensitivity of said first photoelectric conversion element of R1, the sensitivity being an amount of signal charges in response to an exposure amount, a saturated output voltage at a maximum accumulated charge amount is Vsat1, a sensitivity of said second photoelectric conversion element is R2, and a saturated output voltage of said second photoelectric conversion element is Vsat2, and Vsat1/Vsat2=x and R1/R2=y, a ratio $(y+1)/(x+1)$ is larger than 1.

21. The solid state image pickup device according to claim 18, wherein for a sensitivity of said first photoelectric conversion element of R1, the sensitivity being an amount of signal charges in response to an exposure amount, a saturated output voltage at a maximum accumulated charge amount is Vsat1, a sensitivity of said second photoelectric conversion element is R2, and a saturated output voltage of said second photoelectric conversion element is Vsat2, and Vsat1/Vsat2=x and R1/R2=y, a ratio $(y+1)/(x+1)$ is larger than 1.

22. The solid state image pickup device according to claim 19, further comprising:
- a charge reading device disposed near each pixel;
- a first transfer control electrode for transferring electric charges accumulated in said first photoelectric conversion element to said charge reading device; and
- a second transfer control electrode electrically separated from said first transfer control electrode, for transferring electric charges accumulated in said second photoelectric conversion element to said charge reading device, wherein said charge reading device is a channel region of a vertical charge coupled device.

23. The solid state image pickup device according to claim 20, further comprising:
- a charge reading device disposed near each pixel;
- a first transfer control electrode for transferring electric charges accumulated in said first photoelectric conversion element to said charge reading device; and
- a second transfer control electrode electrically separated from said first transfer control electrode, for transferring electric charges accumulated in said second photoelectric conversion element to said charge reading device, wherein said charge reading device is a channel region of a vertical charge coupled device.

24. The solid state image pickup device according to claim 21, further comprising:
- a charge reading device disposed near each pixel;
- a first transfer control electrode for transferring electric charges accumulated in said first photoelectric conversion element to said charge reading device; and
- a second transfer control electrode electrically separated from said first transfer control electrode, for transferring electric charges accumulated in said second photoelectric conversion element to said charge reading device, wherein said charge reading device is a channel region of a vertical charge coupled device.

25. The solid state image pickup device according to claim 7, wherein said charge reading device is a channel region of a vertical charge coupled device.

* * * * *